(12) United States Patent
Tanigawa

(10) Patent No.: US 6,902,369 B2
(45) Date of Patent: Jun. 7, 2005

(54) ELEVATING MECHANISM, CARRIER CONVEYING APPARATUS AND HEAT TREATMENT INSTALLATION

(75) Inventor: Osamu Tanigawa, Shiroyama-machi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/289,636

(22) Filed: Nov. 7, 2002

(65) Prior Publication Data

US 2003/0063970 A1 Apr. 3, 2003

Related U.S. Application Data

(60) Division of application No. 09/773,379, filed on Feb. 1, 2001, now Pat. No. 6,499,933, which is a continuation-in-part of application No. 09/050,000, filed on Mar. 30, 1998, now abandoned.

(30) Foreign Application Priority Data

Apr. 3, 1997 (JP) .......................................... 09-101044

(51) Int. Cl.$^7$ ................................................ B66F 7/00
(52) U.S. Cl. ...................... 414/674; 187/361; 187/362; 187/367; 187/368
(58) Field of Search .......................... 414/674; 187/361, 187/362, 367, 368

(56) References Cited

U.S. PATENT DOCUMENTS

| | | | |
|---|---|---|---|
| 226,478 A | * 4/1880 | Bissell et al. | ................ 187/362 |
| 1,508,492 A | 9/1924 | Wright | |
| 1,714,297 A | * 5/1929 | Crispen | ....................... 187/362 |
| 1,752,987 A | 4/1930 | Hansen | |
| 5,645,419 A | 7/1997 | Ohsawa et al. | |

FOREIGN PATENT DOCUMENTS

| | | | | |
|---|---|---|---|---|
| AU | 403201 | * | 4/1966 | ................. 187/368 |
| DE | 2933746 | * | 3/1980 | |
| RU | 1184780 | * | 10/1985 | ................. 187/368 |
| RU | 1728109 | * | 4/1992 | ................. 187/368 |

* cited by examiner

Primary Examiner—Eileen D. Lillis
Assistant Examiner—Michael Lowe
(74) Attorney, Agent, or Firm—Smith, Gambrell & Russell, LLP

(57) ABSTRACT

In an elevating mechanism 14 where an elevating mechanism 17 carried so as to rise and fall along a fixed surface 16 is moved up and down through a suspension member 18, a braking mechanism 18 is born by the elevating mechanism 17 so as to pivot vertically. A tensile spring 32 is provided on the braking mechanism 31, for pivotally urging it to the direction close to the fixed surface 16, while the suspension member 18 is connected to the braking mechanism 31, for pulling the braking mechanism 31 in the direction apart from the fixed surface 16 due to the weight of the elevating mechanism 17, in opposition to the tensile spring 32. When the suspension member 18 is cut off, then the braking mechanism 31 comes into contact with and digs into the fixed surface 16 by action of the tensile spring 32, so that the elevating mechanism 17 can be stopped from falling.

9 Claims, 6 Drawing Sheets

ELEVATING MECHANISM, CARRIER CONVEYING APPARATUS AND HEAT TREATMENT INSTALLATION

REFERENCE TO A RELATED APPLICATION

This application is a division of application Ser. No. 09/773,379, filed Feb. 1, 2001, now U.S. Pat. No. 6,499,933 which was a continuation-in-part of application Ser. No. 09/050,000, filed Mar. 30, 1998, now abandoned, both of which are relied on and incorporated herein by reference.

BACKGROUND OF THE INVENTION

1. Technical Field of the Invention

The present invention relates to a carrier conveying apparatus which is suitable for conveying carriers or the like in which, for example, substrates to be processed are accommodated and also relates to an elevating mechanism installed in the carrier conveying apparatus. In addition, the invention relates to a heat treatment installation.

2. Description of the Related Art

In general, a production process of semiconductor devices includes various steps of applying an oxidation process, diffusion process and CVD process etc. on semiconductor wafers as objects to be processed. Thus, in view of the improvement of throughput, cleanness and space-conserving etc. of these steps, a variety of processing apparatuses have been proposed [e.g. see Japanese Unexamined Patent Publication (Kokai) No.4-133422].

For example, the processing apparatus disclosed in the above publication includes a vertical heat treatment furnace arranged on a rear and upper side inside a casing of the apparatus, for heat-treating a great number of wafers at a time, using a wafer boat as a carrier for objects to be processed. On the front side of the casing, a carrier input/output port (also called an I/O port) is provided for inputting and outputting a carrier as a container for accommodating a plurality of wafers therein.

Inside the above-mentioned casing, there are provided a carrier keeping section which is positioned on an upper side of the casing close to the carrier I/O port, for keeping a plurality of carriers; a carrier set-up section and a wafer boat set-up section both of which are arranged between the carrier I/O port and the heat treatment furnace, for delivering the wafers between the carrier and the wafer boat; and a wafer conveying mechanism for delivering the wafers between the carrier set-up section and the wafer boat set-up section. Further arranged in the casing is a carrier conveying apparatus with an elevating mechanism, which carries out the delivery of carriers between the carrier I/O port and the carrier keeping section, between the carrier keeping section and the carrier set-up section or between the carrier I/O port and the carrier set-up section.

Since it is necessary that, in the carrier conveying apparatus, the elevating mechanism has a relatively large stroke of e.g. 3 m to 5 m and the difficulty that the elevating mechanism employs a ball screw, a mechanism to elevate an elevating mechanism suspended by a wire or a timing belt as a suspension member is adopted as the elevating mechanism. Despite high strength in the suspension member, it is expected that if the suspension member is broken off, then utensils might be damaged because of the drop of such a heavy elevating mechanism weighing 70 to 80 kg, for example. Therefore, the above elevating mechanism is so constructed that, when a sensor detects the cutting of the suspension member, the elevating mechanism is stopped by a brake mechanism, thereby preventing the mechanism from falling.

In the above-mentioned elevating mechanism, however, it is necessary to provide a sensor for detecting the cutting of the suspension member and a control unit with electric circuits for controlling the brake mechanism by inputting a signal from the sensor etc. Therefore, with the increase in manufacturing cost and necessity of using electricity, there is a possibility that the elevating mechanism will have a faulty operation due to misidentification by the sensor.

SUMMARY OF THE INVENTION

Accordingly, it is therefore an object of the present invention to provide an elevating mechanism which is capable of mechanically stopping an elevating mechanism, not electrically, when the suspension member is broken off, whereby the elevating mechanism can be prevented from falling and to also provide a carrier conveying apparatus having the elevating mechanism.

According to the first feature of the invention, there is a provided an elevating mechanism comprising:

a guide member arranged along a vertical direction;

a fixed surface arranged in parallel with the guide member;

an elevating mechanism guided so as to rise and fall along the guide member;

a braking mechanism pivotally supported by the elevating mechanism in a vertical plane, the braking mechanism being in a position apart from the fixed surface under a normal condition of the braking mechanism and being rotated in a direction approaching the fixed surface from an underside of the elevating mechanism when the elevating mechanism falls, whereby the braking mechanism is engaged with the fixed surface to brake the elevating mechanism;

urging means for urging the braking mechanism to rotate in the direction approaching the fixed surface from the underside of the elevating mechanism;

a suspension member connected to the braking mechanism, for suspending the elevating mechanism through an intermediary of the braking mechanism, the suspension member, owing to its tensile strength to suspend the elevating mechanism, also rotationally urging the braking mechanism in a direction to separate the braking mechanism from the fixed surface in opposition to the rotating force due to the urging means; and a stopper for stopping the rotation of the braking mechanism due to the tensile strength of the suspension member;

said stopper including:

a stopper member fixed to said braking mechanism, said stopper member having a stopper surface; and an abutment member fixed to said elevating mechanism, said abutment member having an abutment surface;

whereby, said stopper stops the rotation of said braking mechanism due to the tensile strength of said suspension member by engaging said abutment surface with said stopper surface of said stopper member:

whereby, when the suspension member is cut off, the braking mechanism to which urging force due to the tensile strength of the suspension member is not applied any longer is rotated against the fixed surface by the urging means, so that the elevating mechanism can be braked.

According to this feature, when the suspension member is cut off, it is possible to stop the elevating mechanism mechanically, and not electrically, so that the elevating mechanism can be prevented from falling.

The second feature of the invention resides in a carrier conveying apparatus comprising:

a fixed frame arranged so as to extend in a vertical direction;

a supporting arm adapted so as to move in the vertical direction along the fixed frame, for conveying a carrier having an object to be processed accommodated therein; and an elevating mechanism arranged between the fixed frame and the supporting arm, for moving the supporting arm to a predetermined position in the vertical direction and maintaining the supporting arm thereat so as not to fall down, the elevating mechanism including:

a guide member arranged on the fixed frame along a vertical direction;

a fixed surface arranged in parallel with the guide member;

an elevating mechanism guided so as to rise and fall along the guide member, for supporting the supporting arm;

a braking mechanism pivotally supported by the elevating mechanism in a vertical plane, the braking mechanism being in a position apart from the fixed surface under a normal condition of the braking mechanism and being rotated in a direction approaching the fixed surface from an underside of the elevating mechanism when the elevating mechanism falls, whereby the braking mechanism is engaged with the fixed surface to brake the elevating mechanism;

urging means for urging the braking mechanism so as to rotate in the direction approaching the fixed surface from the underside of the elevating mechanism;

a suspension member connected to the braking mechanism, for suspending the elevating mechanism through an intermediary of the braking mechanism, the suspension member, owing to its tensile strength to suspend the elevating mechanism, also rotationally urging the braking mechanism in a direction to separate the braking mechanism from the fixed surface in opposition to rotating force due to the urging means; and a stopper for stopping the rotation of the braking mechanism due to the tensile strength of the suspension member;

said stopper including:

a stopper member fixed to said braking mechanism, said stopper member having a stopper surface; and an abutment member fixed to said elevating mechanism, said abutment member having an abutment surface;

whereby, said stopper stops the rotation of said braking mechanism due to the tensile strength of said suspension member by engaging said abutment surface with said stopper surface of said stopper member;

whereby, when the suspension member is cut off, the braking mechanism to which urging force due to the tensile strength of the suspension member is not applied any longer is rotated against the fixed surface by the urging means, so that the elevating mechanism can be braked from falling.

According to this feature, when the suspension member is cut off, it is possible to stop the elevating mechanism without depending on an electrical method but a mechanical method instead, thereby preventing the elevating mechanism from falling. Particularly, in conveying a carrier for an expensive and heavy semiconductor wafer, it is possible to prevent the wafer from being damaged by falling and prevent control instruments disposed under the supporting arm from being damaged.

The third feature of the invention resides in the carrier conveying apparatus wherein the braking mechanism includes:

a shaft for rotating the braking mechanism;

a braking member arranged so as to project from the shaft radially outward, the braking member, at a time of the elevating mechanism falling down, being rotationally forced between the shaft and the fixed surface thereby to press the fixed surface; and a suspension member connecting part arranged across the shaft from the fixed surface, the suspension member connecting part having the suspension member connected thereto.

According to this feature, since the suspension member is connected to the suspension member connecting part disposed across the shaft from the fixed surface, it is possible to avoid the braking member rotating toward the fixed surface due to the suspension member vibrations or the like, thereby preventing the wrong operation of the braking member. Further, since the carrier conveying apparatus is adapted so as to force the braking member between the shaft and the fixed surface from the underside at the time of the elevating mechanism falls down, it is possible to lock the braking member on the fixed surface securely, so that the elevating mechanism can be stopped.

The fourth feature of the invention resides in the carrier conveying apparatus wherein the braking member has a press surface formed on a leading end thereof to be pressed on the fixed surface, the press surface being formed in a manner that a distance between the press surface and the shaft increases in the opposite direction to the rotating direction of the braking member.

The fifth feature of the invention resides in the carrier conveying apparatus wherein the braking member is provided, on the press surface, with a tooth part which encroaches on the fixed surface when the braking member is pressed against the fixed surface.

The sixth feature of the invention resides in the carrier conveying apparatus wherein the braking member is shaped in the form of a lever.

The seventh feature of the invention resides in the carrier conveying apparatus wherein the urging means comprises a tensile spring.

The eighth feature of the invention resides in the carrier conveying apparatus wherein the urging means comprises a weight.

The ninth feature of the invention resides in the carrier conveying apparatus wherein the suspension member is a toothed belt.

The tenth feature of the invention resides in the carrier conveying apparatus wherein the suspension member is a wire.

The eleventh feature of the invention resides in the carrier conveying apparatus wherein the fixed surface is made of aluminum.

The twelfth feature of the invention resides in the carrier conveying apparatus wherein the fixed surface is provided, thereon, with an engagement projection and wherein the braking mechanism comprises:

a shaft for allowing the braking mechanism to be rotated;

an engagement member arranged so as to project from the shaft radially outward, the engagement member having a leading end thereof formed for engagement with the engagement projection on the fixed surface; and a suspension member winding part about which the suspension member is wound, the suspension member winding part being rotatable about the shaft.

According to this feature, since the engagement projection is adapted so as to engage with the engagement member, it is possible to carry out braking and stopping for the elevating mechanism.

The thirteenth feature of the invention resides in the carrier conveying apparatus wherein the engagement member is provided, at a tip thereof, with a claw part for engagement with the engagement projection on the fixed surface.

The fourteenth feature of the invention resides in the carrier conveying apparatus wherein the suspension member is a toothed belt.

The fifteenth feature of the invention resides in the carrier conveying apparatus wherein the urging means comprises a tensile spring.

The sixteenth feature of the invention resides in the carrier conveying apparatus wherein the urging means comprises a torsion spring which is wound about the shaft.

According to a still further feature, the present invention also relates to a heat treatment installation including a carrier I/O port for receiving and taking out a carrier which accommodates a substrate;

a carrier keeping section for keeping the carrier;

a carrier set-up section where the carrier is set-up for receiving and taking out the substrate;

a heat treatment apparatus for heat-treatment of the substrate;

a substrate conveyer mechanism for conveying the substrate between the carrier setup up section and the heat treatment apparatus;

a carrier conveying apparatus for conveying the carrier between the I/O port, the carrier keeping section and the carrier set-up section, the carrier conveying apparatus including:

a fixed frame arranged so as to extend in a vertical direction;

a supporting arm adapted so as to move in the vertical direction along said fixed frame, for conveying a carrier having an object to be processed accommodated therein; and an elevating mechanism arranged between said fixed frame and said supporting arm, for moving said supporting arm to a predetermined position in the vertical direction and maintaining said supporting arm thereat so as not to fall down, said elevating mechanism including:

a guide member arranged on said fixed frame along a vertical direction;

a fixed surface arranged in parallel with said guide member;

an elevating mechanism guided so as to rise and fall along said guide member, for supporting said supporting arm;

a braking mechanism pivotally supported by said elevating mechanism in a vertical plane, said braking mechanism being in a position apart from said fixed surface under a normal condition of said braking mechanism and being rotated in a direction approaching said fixed surface from an underside of said elevating mechanism when said elevating mechanism falls, whereby said braking mechanism is engaged with said fixed surface to brake said elevating mechanism;

urging unit for urging said braking mechanism to rotate in the direction approaching said fixed surface from the underside of said elevating mechanism;

a suspension member connected to said braking mechanism, for suspending said elevating mechanism through an intermediary of said braking mechanism, said suspension member, owing to its tensile strength to suspend said elevating mechanism, also rotationally urging said braking mechanism in a direction to separate said braking mechanism from said fixed surface in opposition to the rotating force due; and a stopper including:

a stopper member fixed to said braking mechanism, said stopper member having a stopper surface; and an abutment member fixed to said elevating mechanism, said abutment member having an abutment surface;

whereby, said stopper stops the rotation of said braking mechanism due to the tensile strength of said suspension member by engaging said abutment surface with said stopper surface of said stopper member;

whereby, when said suspension member is cut off, said braking mechanism to which urging force due to the tensile strength of said suspension member is not applied any longer is rotated against said fixed surface by said urging unit, so that said elevating mechanism can be braked.

DESCRIPTION OF THE PREFERRED EMBODIMENT

Figure 1A:
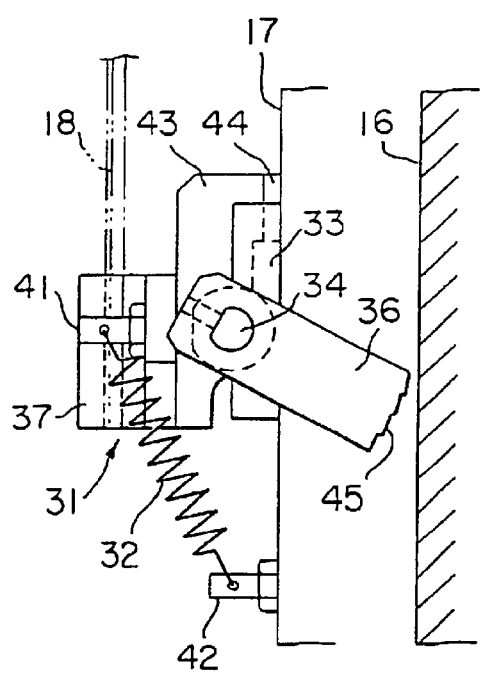
FIG. 1A is a side view of an inactivated condition and FIG. 1B is a side view of an activated condition of a carrier conveying apparatus, showing a first embodiment of the present invention.
Figure 1B:
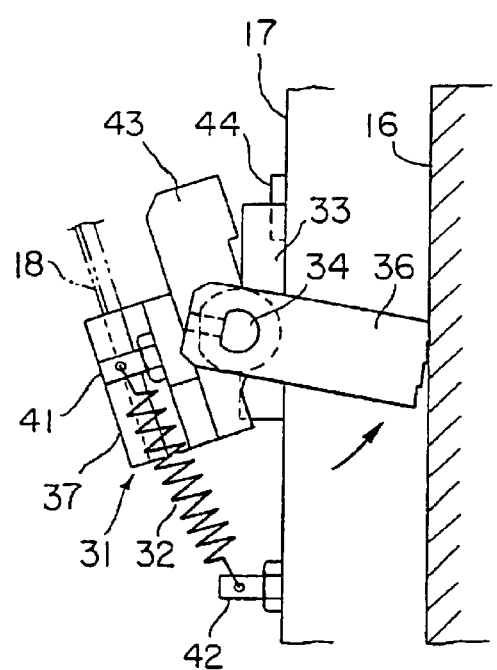
Figure 2:
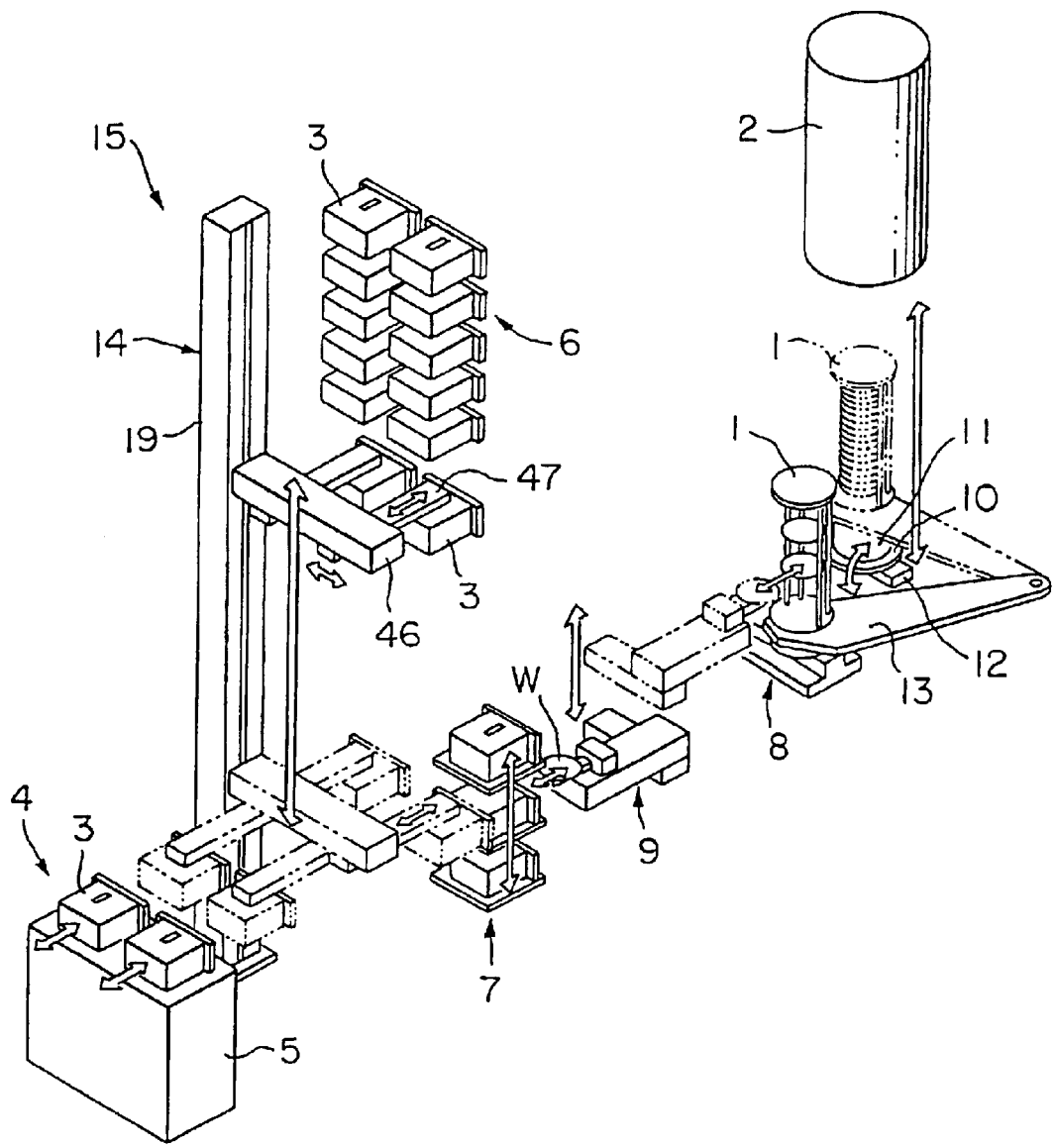
FIG. 2 is a perspective view showing a schematic representation of a heat treatment installation having the carrier conveying apparatus.
Figure 3A:
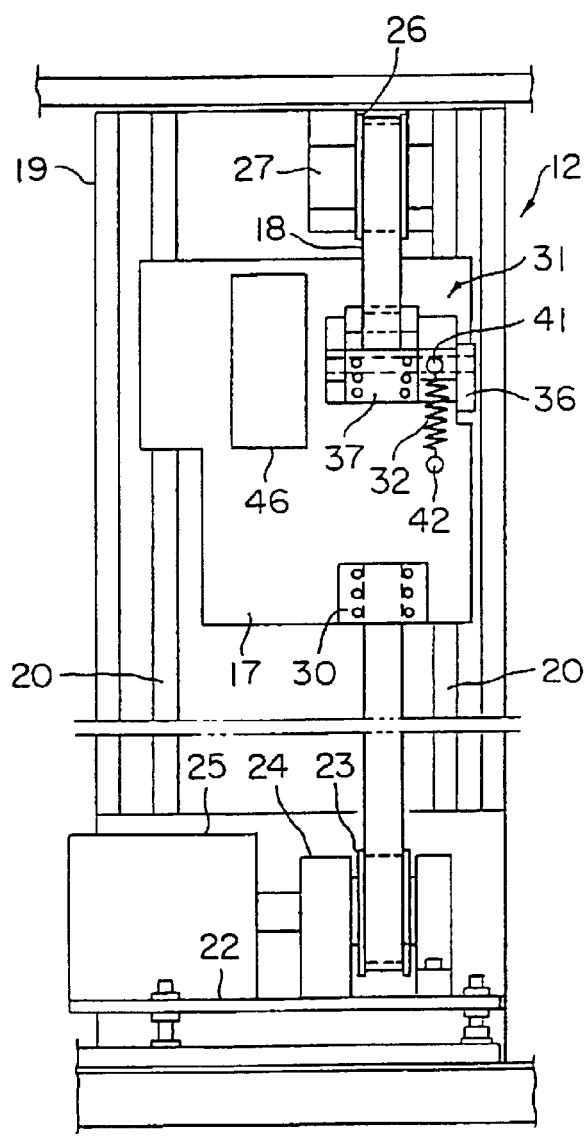
FIG. 3A is a front view of an elevating mechanism of the carrier conveying apparatus and FIG. 3B is a side view of the elevating mechanism, showing the elevating mechanism of the carrier conveying apparatus.
Figure 3B:
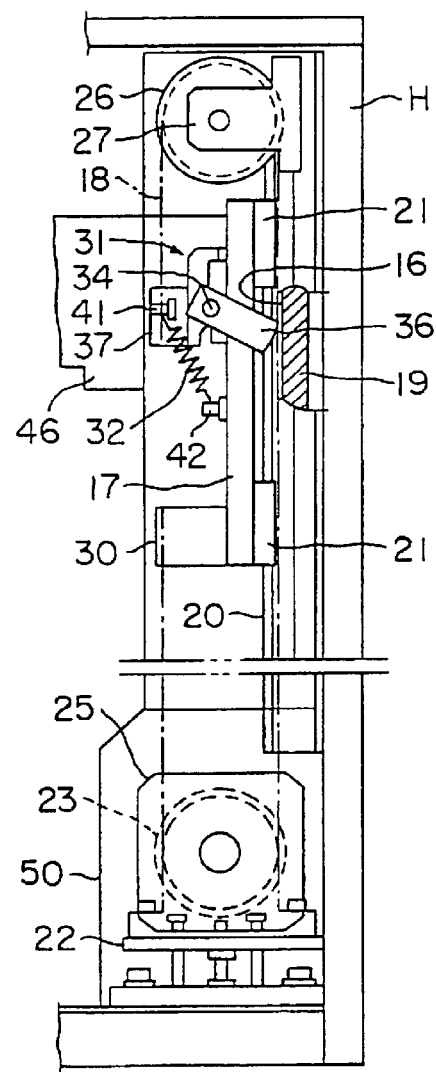
Figure 4:
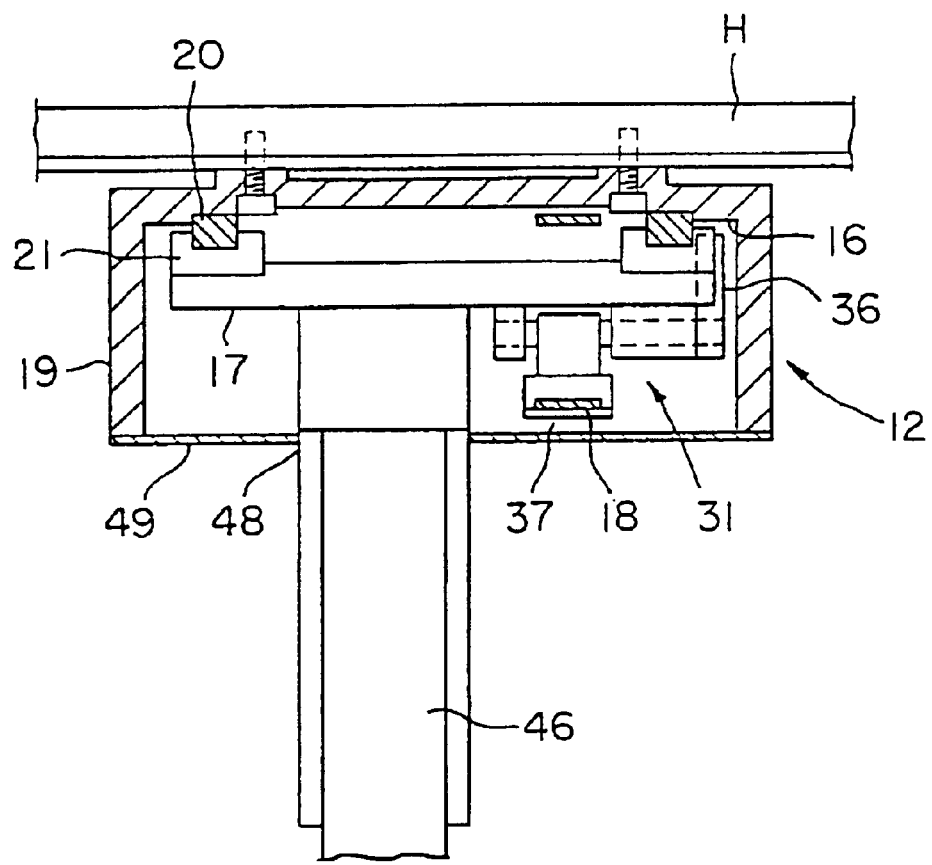
FIG. 4 is a flat cross-sectional view of the elevating mechanism of the carrier conveying apparatus.
Figure 5:
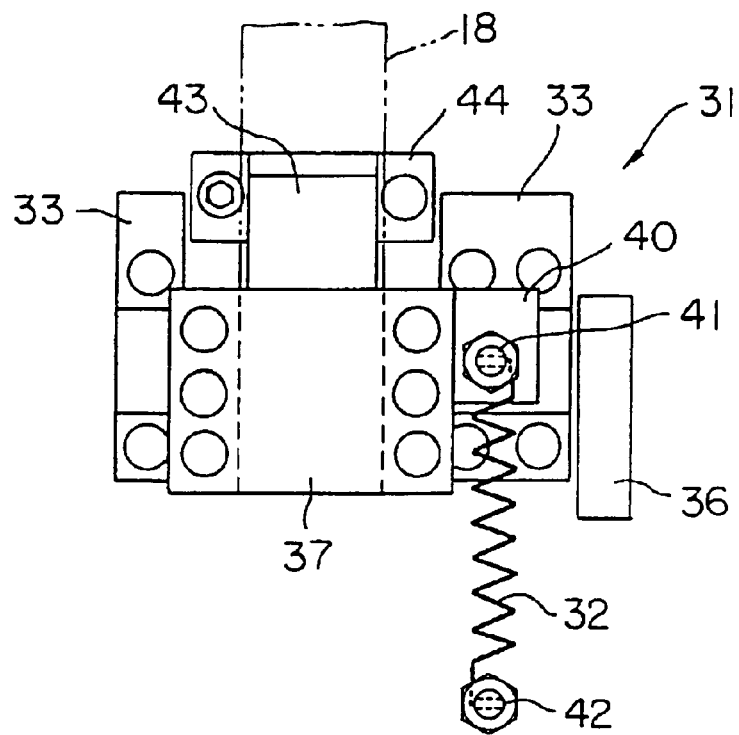
FIG. 5 is a front view of a braking mechanism.
Figure 6:
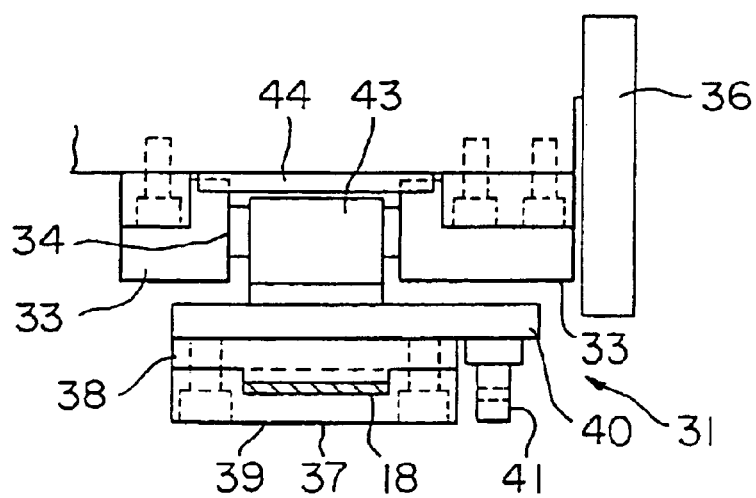
FIG. 6 is a plan view of the braking mechanism.
Figure 7A:
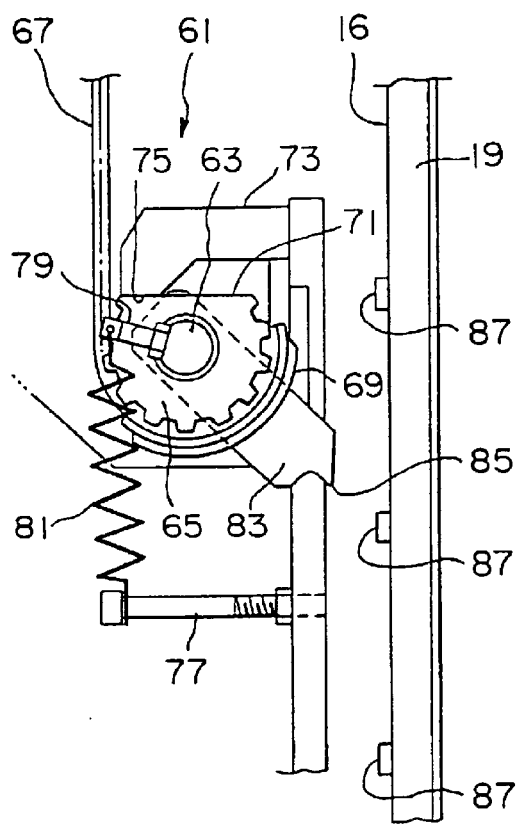
FIG. 7A is a side view of an inactivated condition of the elevating mechanism and FIG. 7B is a side view of an activated condition of the elevating mechanism, showing a first embodiment of the present invention.
Figure 7B:
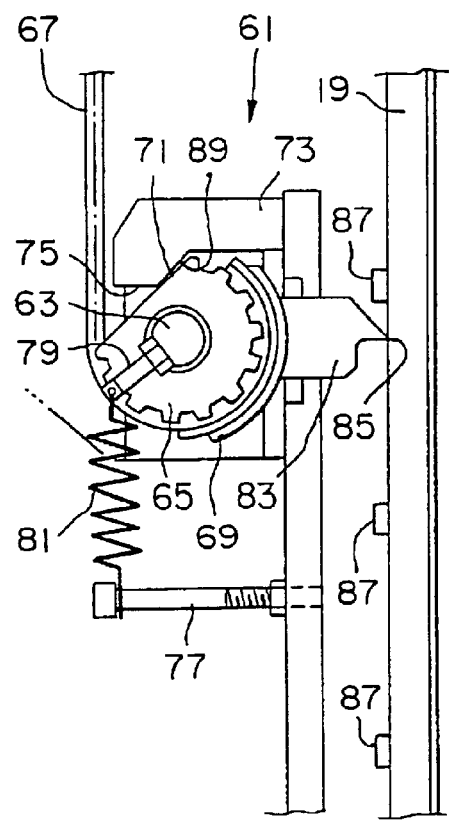

Referring to the drawings, embodiments of the present invention will be described as below. FIGS. 1(1A and 1B) are views showing the first embodiment: FIG. 1A a side view of the inactivated condition, FIG. 1B a side view of the activated condition; FIG. 2 a perspective view showing a schematic constitution of a heat treatment installation having a carrier conveying apparatus; FIGS. 3(3A and 3B) views showing an elevating mechanism of the carrier conveying apparatus: FIG. 3A a front view thereof, FIG. 3B a side view thereof, FIG. 4 a flat cross-sectional view of the elevating mechanism of the carrier conveying apparatus; FIG. 5 a front view of a braking mechanism; FIG. 6 a plan view of the braking mechanism; and FIGS. 7(7A and 7B) are views showing the second embodiment of the present invention: FIG. 7A a side view of an inactivated condition thereof, and FIG. 7B is a side view of an activated condition thereof.

At first, we describe the schematic representation of the heat treatment installation having the carrier conveying apparatus with reference to FIG. 2. The heat treatment installation has a vertical heat treatment harness 2 which is positioned inside a not-shown casing on rear and upper sides thereof and which is capable of heat-treating a great number of wafers W to be processed at a time, by using a wafer boat 1 as a retainer for retaining the objects to be processed. On the front side of the casing, a carrier input/output port (also called an I/O port) 4 is provided for inputting or outputting carriers 3 each having a plurality of wafers W accommodated therein.

Inside the casing, on the lower side of the carrier I/O port 4, a carrier mount 5 is arranged to mount the carriers 3 thereon, while a carrier keeping section 6 in the form of a shelf is arranged to keep the plural carriers 3 above the carrier I/O port 4. Arranged between the carrier I/O port 4 and the heat treatment harness 2 are a carrier set-up section 7 in which the carriers 3 are set up and a wafer boat set-up section 8 in which the wafer boat 1 is also set up. Between the carrier set-up section 7 and the wafer boat set-up section 8, a wafer conveyer mechanism (also called after conveying mechanism 9 is provided for delivering the wafers W.

Arranged below the heat treatment harness 2 is an elevating mechanism 12 which mounts the wafer boat 1 on a lid 10 for opening or closing a furnace opening through the intermediary of a heat-trapping cylinder 11, so that the wafer boat 1 is elevated together with the heat-trapping cylinder 11 in order to input or output the wafers W from a predetermined temperature area in the heat treatment harness 2, and a wafer boat conveying mechanism 13 which conveys the wafer boat 1 from the heat-trapping cylinder 11 on the lid 10 to the wafer boat set-up section 8, and vice versa.

Further, a carrier conveying apparatus 15 with an elevating mechanism 14 is provided in the casing, for carrying out the delivery of carriers between the carrier mount 5 of the carrier I/O port 4 and the carrier keeping section 6, between the carrier keeping section 6 and the carrier set-up section 7 or between the carrier I/O port 4 and the carrier set-up section 7. As shown in FIGS. 3 and 4, this carrier conveying apparatus 15 includes an elevating mechanism 14 for elevating an elevating mechanism 17, which mechanism is supported so as to be elevatable along a substantially vertical fixed surface 16, through a timing belt 18 as a suspension member.

This elevating mechanism 14 includes a fixed frame 19 of a U-shaped cross section opened on a front side thereof, providing the above fixed surface 16 by an inner surface of the frame 19. Being generally standing upright, the fixed frame 19 is fixed on an inner wall of a casing H through bolts or the like. The elevating mechanism 17 is carried so as to move up and down in the fixed frame 19. As to materials of the fixed frame 19, it is preferably made of metal which exhibits high rigidity and into which a braking member 36 described later is easy to grab, for example aluminum alloy.

Provided on the inner face of the fixed frame 19 in the longitudinal direction are a pair of left and right guide rails 20 on which the elevating mechanism 17 is carried so as to move up and down through supporting bodies 21. It is preferable that the supporting bodies 21 are slidably arranged on the guide rails 20 so as to constitute a liner guide. In the modification, the supporting bodies 21 may be constructed so as to travel on the guide rails 20 through wheels.

As driving means for the elevating mechanism 14, a drive pulley 23 for driving the timing belt 18 is mounted on a driver mounting table 22 through a bearing 24 so as to rotate in a plane perpendicular to the table 22 and a motor 25 for rotating the drive pulley 23 is also mounted on the table 22. The driver mounting table 22 is arranged so as to be adjustable in height on a floor beneath the fixed frame 19. Further, on the upper end of the inner surface of the fixed frame 19, a driven pulley 26 in association with the drive pulley 23 is mounted so as to rotate in the perpendicular plane through a bearing 27.

It is desirable that, in a viewpoint of tensile strength, the timing belt 18 includes core members embedded therein. This timing belt 18, not being endless but with ends, is wound in a C-shaped manner so as to extend over the driven pulley 23 and the corresponding driven pulley 26. The upper end of the belt 18 is securely connected to a braking mechanism 31 described later, while the lower end is connected to the elevating mechanism 17. On the lower end of the elevating mechanism 17, a belt securing part 30 is provided for clamping the lower end of the timing belt 18 for fixture.

On the elevating mechanism 17, a braking mechanism 31 is supported so as to pivot in the perpendicular plane. The braking mechanism 31 is provided with a tensile spring 32 as urging means which urges the mechanism 31 in the direction approaching to the fixed surface 16. While, the upper end of the timing belt 18 is connected to the braking mechanism 17, for pulling it in the direction apart from the fixed surface 16 owing to the weight of the elevating mechanism 17 in opposition to the urging of the tensile spring 32. Consequently, when the timing belt 18 is broken off, the braking mechanism 21 comes into contact with the fixed surface 16 by the action of the tensile spring 32, so that the elevating mechanism 17 can be stopped.

As also shown in FIGS. 5 and 6, the braking mechanism 31 includes a shaft 34 mounted on the elevating mechanism 17 through a bearing 33 so as to rotate in a plane perpendicular to the mechanism 17, a braking member 36 fixed on one end of the shaft 34 so as to obliquely extend downward to the fixed surface 16 and a belt fixing part 37 provided for fixing the upper end of the timing belt 18 to the shaft 34. The belt fixing part 37 comprises clamping members 38, 39 for clamping the timing belt 18 by fastening bolts. The lower clamping member 38 is fixed on a mounting table 40 arranged on the shaft 34.

On the mounting table 40, a spring hooking part 41 is attached to hook one end of the tensile spring 32, while another hooking part 42 for hooking the other end of the tensile spring 32 is attached to the elevating mechanism 17. As shown in FIG. 1A, the belt fixing part 37 is arranged in a position deviated from the shaft 34 so as to produce moment in the clockwise direction (i.e. a direction to separate the braking member from the fixed surface) on the shaft 34 due to the tensile strength of the timing belt 18, i.e., the weight of the elevating mechanism 17. In order to prevent the shaft 34 from over-rotating by the moment, the shaft 34 is provided with a stopper member 43 extending upward, while the elevating mechanism 17 is provided with an abutment plate 44 for abutment on a tip of the stopper member 43.

On the other hand, the tensile spring 32 is expanded so that moment in the counter-clockwise direction (i.e. a direction to close the braking member 36 to the fixed surface) occurs in the shaft 34. Then, a spring force of the tensile spring 32 is established to be smaller than the tensile strength of the timing belt 18, i.e., the weight of the elevating mechanism 17. With the establishment, without an arbitrary rotation of the braking mechanism 31 to the side of the fixed surface 16 during the traveling operation of the elevating mechanism 17, the braking mechanism 31 is constructed in a manner that when the timing belt 18 is cut off, then the mechanism 31 pivots to the side of the fixed surface 16 automatically, as shown in FIG. 1B.

Preferably, the braking member 36 is shaped in the form of a lever extending obliquely downward to the side of the fixed surface 16. Further, it is desirable that the braking member 36 is provided, at a tip thereof, with a structure which can produce large frictional resistance at braking when the braking member 36 comes into contact with the fixed surface 16, for example, a toothed part 45 facilitating the tip grabbing into the fixed surface 16.

Integrally formed with the elevating mechanism 17 is an elevating arm 46 which is in the form of a cantilever extending horizontally to the front and to which supporting arms 47 are attached for movably supporting the carrier 3 in the horizontal direction. It is preferable that, as shown in FIG. 2, the supporting arms 47 are positioned on the under part of the elevating arm 46 while making a pair and also arranged so as to be horizontally movable in the longitudinal direction of the elevating arm 46 and in a direction perpendicular to the longitudinal direction of the elevating arm 46. In addition, preferably, the supporting arms 47 are constructed so as to detachably support the upper parts of the carriers 3 and move them in the longitudinal direction of the carriers 3.

Note, as shown in FIG. 4, the front surface of the fixed frame 19 is covered with a cover plate 49 having a slit 48 allowing the elevating arm 46 to move therein. Further, preferably, a driving part of the elevating mechanism 14 is covered with a cover 50, as shown in FIG. 3B. The elevating mechanism 14 is provided with a sensor for detecting a moving distance and a height of the elevating mechanism 17, while the supporting arm 47 is also provided with various sorts of sensors. Thus, the elevating mechanism 14 and the supporting arm 47 are controlled by a control device automatically or semi-automatically (not shown).

Next, we describe the operation of the above-constructed carrier conveying apparatus 15. When energizing the motor 25, the driving force is transmitted from the drive pulley 23 to the elevating mechanism 17 through the timing belt 18, so that the elevating mechanism 17 rises or falls. Owing to this upward and downward movements of the elevating mechanism 17 and the driving of the supporting arm 47, the delivery of the carriers 3 is carried out between the carrier mount 5 of the carrier I/O port 4 and the carrier keeping section 6, between the carrier keeping section 6 and the carrier set-up section 7, or between the carrier I/O port 4 and the carrier set-up section 7.

Now, since the elevating mechanism 17 is suspended by the drive pulley 26 through the timing belt 18 wound about the pulley 26, there is a possibility that the elevating mechanism 17 will fall due to its weight if the timing belt 18 is cut off. However, the braking mechanism 31 is supported on the elevating mechanism 17 so as to be pivotable in the vertical plane and the tensile spring 32 pivotally urging the braking mechanism 31 in the direction approaching the fixed surface 16 of the fixed frame 19 is attached to the braking mechanism 31, while the timing belt 18 is connected to the braking mechanism 21, for pulling it in the direction apart from the fixed surface 15 due to the weight of the elevating mechanism 17, in opposition to the tensile spring 32.

Therefore, when the timing belt 18 is cut off, the braking mechanism 31 is forcibly rotated against the fixed surface 16 by the tensile spring 32, so that the braking mechanism 31 comes into contact with the fixed surface 16 and grabs thereinto. The elevating mechanism 17 is stopped by the braking action due to friction and grabbing at that time, so that it is possible to prevent the elevating mechanism 17 from falling.

In detail, owing to the rotation of the braking mechanism 31, the tip of the braking member 36 comes into contact with the fixed surface 16 of the fixed frame 19 and subsequently, by the friction and the weight of the elevating mechanism 17, the braking member 36 is further rotated to press the fixed surface 16 strongly and grab into the surface 16 into the locked condition, so that the elevating mechanism 17 is stopped. In order to produce such a braking action, it is necessary that the elevating mechanism 17 is securely supported on the guide rail 20 so that the elevating mechanism 17 does not displace to a direction apart from the fixed surface 16, while a distance between the shaft 34 and the tip of the braking member 36 is established larger than a distance between the shaft 34 and the fixed surface 16.

In this way, according to the carrier conveying apparatus 15, it is so constructed that when the timing belt 18 for elevating the elevating mechanism 17 along the fixed surface 16 is cut off, then the tensile spring 32 causes the braking mechanism 31 to come in contact with the fixed surface 16 and grab into it to stop the elevating mechanism 17. Consequently, such an arrangement makes it possible to stop the elevating mechanism 17 mechanically, and not electrically, whereby the elevating mechanism 17 can be prevented from falling. Accordingly, with no use of an electrical control unit as a safety device to prevent the elevating mechanism 17 from falling by stopping it in case of cutting of the timing belt 18, electricity is not required thereby to reduce the cost. Additionally, since there is no possibility to cause the wrong operation of the electrical control unit, it is possible to improve the reliability.

Again, since the elevating mechanism 31 comprises the shaft 34 which is mounted on the elevating mechanism 17 through the bearing 33 so as to be rotatable in the vertical plane, the braking mechanism 36 which is arranged on the shaft 34 so as to extend obliquely downward to the fixed surface 16 and the belt fixing part 37 which is arranged on the shaft 34 to connect the timing belt 18 securely, the braking mechanism 31 with the simple structure and reliable operation can be obtained thereby to reduce cost. It is noted that by making the braking mechanism 31 return to the original position while replacing the cut timing belt 18 with a new timing belt, it is possible to re-start the operation of the carrier conveying apparatus 15.

As above, although the embodiment of the present invention has been described with reference to the drawings, the invention is not limited to the above-mentioned embodiment and various changes and modifications in design may be made without departing from the spirit and scope of the present invention. For example, besides the form of a lever, the braking member 36 may be cam-shaped. Alternatively, it may be shaped in the form of a fan. For instance, it may be a fan-shaped braking member of which center is fixed to the shaft 34 and which is provided, on a periphery thereof, with a plurality of tooth portions. Although the tensile spring 31 is preferable for means for urging the braking member 31, it may be either one of a compression spring, a spiral spring, a plate spring and so on. Alternatively, a weight etc. may be replaced with such a spring. The invention as claimed in claim 1 is also applicable to an elevating mechanism and the carrier conveying apparatus. In this case, the suspension member may be constructed by, for example, a wire besides the timing belt. In the modification, a wire-hoisting drum may be attached to the upper end of the fixed frame.

Next, FIGS. 7A and 7B show another embodiment of the elevating mechanism. As similar to the elevating mechanism 17 shown in FIG. 4, this elevating mechanism 61 is slidably arranged on the guide rails 20 mounted on the fixed frame 19, through the intermediary of the supporting bodies 21. The elevating mechanism 61 is provided with bearings (not shown) which bear a shaft 63 having a gear (corres the timing pulley) 65 fixed thereto. On the periphery of the gear (the timing pulley) 65, one end of a timing belt 67 is wound thereabout and fixed to the gear-shaped periphery by metal fittings 69. Similarly to the embodiment of FIG. 3, the timing belt 67 is wound round the upper driven pulley and the lower drive pulley, so that the elevating mechanism can be moved upward and downward by rotating the drive pulley.

A chamfer 71 is formed on the upper side of the gear (the timing pulley), while the elevating mechanism 61 is provided with a stopper 73 opposing to the chamfer 71. In this arrangement, the timing belt 67 applies a rotating force in the counter-clockwise direction of FIG. 7A on the gear (the timing pulley) 65, as a counterforce supporting the weight of the elevating mechanism 61. Accordingly, as shown in this figure, when the chamfer 71 of the gear (the timing pulley) 65 abuts on a first face 75 of the stopper 73, the gear (the timing pulley) 65 is prevented from further rotating, so that the elevating mechanism 61 is carried by the timing belt 61.

On the other hand, a spring hook 77 is arranged on the lower part of the elevating mechanism 61, while another spring hook 79 is arranged on the shaft 63. A tensile spring 81 is bridged between the spring hook 77 and the spring hook 79. The tensile strength of the tensile spring 81 is established smaller than the tensile strength of the timing belt 67. Thus, so long as the elevating mechanism 61 is suspended by the timing belt 67, the gear (the timing pulley) 65 maintains the chamfer 71 in its position in contact with the first face 75, as shown in FIG. 7A.

An engagement member 83 is secured on the shaft 63. The engagement member 83 is formed so as to project from the shaft 73 obliquely downward and provided, at a tip of the member 83, with a claw part 85.

While, on the fixed surface 16 of the fixed frame 19, engagement projections 87 are provided for engagement with the engagement member 83 at regular intervals.

With the above-mentioned structure, if the timing belt 67 is cut off, then the tension for rotation of the gear (the timing pulley) 65 in the clockwise direction of the figure is lost. Thereupon, as shown in FIG. 7B, the gear (the timing pulley) 65 is rotated in the counter-clockwise direction due to the tension of the tensile spring 81, so that the engagement member 83 projecting obliquely downward is also rotated to direct horizontally. Consequently, the claw part 85 at the tip of the engagement member 83 engages with the engagement projection 87 on the fixed surface 16 while encroaching on the fixed surface 16, so that the elevating mechanism 61 is braked from falling. At that time, the counterclockwise directional force applied on the gear (the timing pulley) 65 is born by the abutment of the chamfer 71 of the gear (the timing pulley) 65 on a second face 89 of the stopper. Alternatively, instead of the above arrangement, the elevating mechanism 61 may be provided with a stopper for preventing the claw part 85 from further rotating over the shown horizontal position.

In this way, according to the elevating mechanism of this embodiment, when the timing belt 67 is cut off, the engagement member 83 is certainly rotated by the tensile spring 81. Thus, without depending on an electrical method, it is possible to stop the falling of the elevating mechanism 51. Further, since the engagement projections 87 are disposed on the fixed surface 16 at regular intervals, it is possible to engage the claw part 85 of the engagement member 83, thereby completing the stopping of falling.

As above, although the embodiment of the present invention has been described with reference to the drawings, the invention is not limited to the above-mentioned embodiment and various changes and modifications in design may be made without departing from the spirit and scope of the present invention. For example, besides the form of a lever, the engagement member 83 may be cam-shaped. In addition, as urging means, it may be a spiral spring wound about the shaft 63 without limiting the above-mentioned tensile spring.

As mentioned above, since the elevating mechanism in accordance with the present invention is constructed so as to abut and retain the braking mechanism on the fixed surface for stopping the elevating mechanism by the urging means when the suspension member is cut off, it is possible to stop the elevating mechanism mechanically, not electrically, thereby to prevent it from dropping. Accordingly, because of no use of an electrical control device, the electricity is not required to therefore reduce the cost and furthermore, there is no possibility to make a wrong operation, thereby improving the reliability.

Again, according to the invention, since the braking mechanism includes the shaft carried by the elevating mechanism through the bearing so as to pivot in the vertical plane, the braking member formed so as to project from the shaft obliquely downward toward the fixed surface and the suspension member connecting part provided on the shaft, for connecting and fixing the timing belt, it is possible to obtain the braking mechanism which operates in spite of its simple structure, whereby the reduction in manufacturing cost can be saved.

What is claimed is:

1. An elevating mechanism comprising:

a guide member arranged along a vertical direction;

a fixed surface arranged in parallel with said guide member;

an elevating body guided so as to rise and fall along said guide member;

a braking mechanism pivotally supported by said elevating body in a vertical plane, said braking mechanism being in a position apart from said fixed surface under a normal condition of said braking mechanism and being rotated in a direction approaching said fixed surface from an underside of said elevating body when said elevating body falls, whereby said braking mechanism is engaged with said fixed surface to brake said elevating body; said braking mechanism including:

a shaft for rotating said braking mechanism;

a braking member arranged so as to project from said shaft radially outward, said braking member, at a time of said elevating body falling down, being rotationally forced between said shaft and said fixed surface thereby to press said fixed surface; and a suspension member connecting part arranged across said shaft;

urging means for urging said braking mechanism to rotate in the direction approaching said fixed surface from an underside of said elevating body;

a suspension member connected to said suspension member connecting part of said braking mechanism, for suspending said elevating body through an intermediary of said braking mechanism, said suspension member, owing to its tensile strength to suspend said elevating body, also rotationally urging said braking mechanism in a direction to separate said braking mechanism from said fixed surface in opposition to rotating force due to said urging unit; and a stopper including:

a stopper member fixed to said braking mechanism, said stopper member radially extending from said shaft and having a stopper surface arranged at an end portion thereof so as to face said elevating body; and an abutment member protruded towards said stopper surface from a surface of said elevating body said abutment member having an abutment surface facing said stopper surface;

whereby, said stopper stops the rotation of said braking mechanism due to the tensile strength of said suspension member by engaging said abutment surface with said stopper surface of said stopper member;

whereby, when the suspension member is cut off, the braking mechanism to which urging force due to the tensile strength of the suspension member is not applied any longer is rotated against the fixed surface by said urging means, so that said elevating body can be braked from falling.

2. A carrier conveying apparatus comprising:

a fixed frame arranged so as to extend in a vertical direction;

a supporting arm adapted so as to move in the vertical direction along said fixed frame, for conveying a carrier having an object to be processed accommodated therein; and an elevating mechanism arranged between said fixed frame and said supporting arm, for moving said supporting arm to a predetermined position in the vertical direction and maintaining said supporting arm thereat so as not to fall down, said elevating mechanism including:

a guide member arranged on said fixed frame along a vertical direction;

a fixed surface arranged in parallel with said guide member;

an elevating body guided so as to rise and fall along said guide member, for supporting said supporting arm;

a braking mechanism pivotally supported by said elevating body in a vertical plane, said braking mechanism being in a position apart from said fixed surface under a normal condition of said braking mechanism and being rotated in a direction approaching said fixed surface from an underside of said elevating body when said elevating body falls, whereby said braking mechanism is engaged with said fixed surface to brake said elevating body;

urging unit for urging said braking mechanism so as to rotate in the direction approaching said fixed surface from the underside of said elevating body;

a suspension member connected to said braking mechanism, for suspending said elevating body through an intermediary of said braking mechanism, said suspension member, owing to its tensile strength to suspend said elevating body, also rotationally urging said braking mechanism in a direction to separate said braking mechanism from said fixed surface in opposition to rotating force due to said urging unit; and a stopper including:

a stopper member fixed to said braking mechanism, said stopper member radially extending from said shaft and having a stopper surface arranged at an end portion thereof so as to face said elevating body; and an abutment member protruding toward said stopper surface from a surface of said elevating body, said abutment member having an abutment surface facing said stopper surface;

whereby, said stopper stops the rotation of said braking mechanism due to the tensile strength of said suspension member by engaging said abutment surface with said stopper surface of said stopper member.

3. A carrier conveying apparatus as claimed in claim 2, wherein said braking member has a press surface formed on a leading end thereof to be pressed on said fixed surface, said press surface being formed in a manner that a distance between said press surface and said shaft increases as directing in the opposite direction to the rotating direction of said braking member caused due to said urging means.

4. A carrier conveying apparatus as claimed in claim 3, wherein said braking member is provided, on said press surface, with a tooth part which encroaches on said fixed surface when said braking member is pressed against said fixed surface.

5. A carrier conveying apparatus as claimed in claim 4, wherein said braking member is shaped in the form of a lever.

6. A carrier conveying apparatus as claimed in claim 2, wherein said urging means comprises a tensile spring.

7. A carrier conveying apparatus as claimed in claim 2, wherein said suspension member is a toothed belt.

8. A carrier conveying apparatus as claimed in claim 2, wherein a member having said fixed surface is made of aluminum.

9. A carrier conveying apparatus according to claim 2, wherein said braking mechanism includes a shaft, said stopper member fixed to said shaft.

* * * * *